(12) United States Patent
Gillotti et al.

(10) Patent No.: US 12,255,172 B2
(45) Date of Patent: Mar. 18, 2025

(54) METHODS OF DETECTING BONDING BETWEEN A BONDING WIRE AND A BONDING LOCATION ON A WIRE BONDING MACHINE

(71) Applicant: Kulicke and Soffa Industries, Inc., Fort Washington, PA (US)

(72) Inventors: Gary S. Gillotti, North Wales, PA (US); Racheli Herskowits, Philadelphia, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 282 days.

(21) Appl. No.: 18/096,179

(22) Filed: Jan. 12, 2023

(65) Prior Publication Data

US 2023/0170325 A1  Jun. 1, 2023

Related U.S. Application Data

(62) Division of application No. 16/890,823, filed on Jun. 2, 2020, now Pat. No. 11,581,285.

(Continued)

(51) Int. Cl.
*H01L 23/00* (2006.01)
*H01L 21/66* (2006.01)

(52) U.S. Cl.
CPC .............. *H01L 24/78* (2013.01); *H01L 22/12* (2013.01); *H01L 22/14* (2013.01); *H01L 24/85* (2013.01); *H01L 2224/78621* (2013.01)

(58) Field of Classification Search
CPC . H01L 2224/78301; H01L 2224/78621; H01L 2224/85045; H01L 24/85;

(Continued)

(56) References Cited

U.S. PATENT DOCUMENTS 4,586,642 A * 5/1986 Dreibelbis .............. H01L 24/85
228/104
8,678,266 B2 3/2014 Mii et al.
(Continued)

FOREIGN PATENT DOCUMENTS

KR 10-2011-0129170 12/2011
KR 10-2015-0046161 4/2015
(Continued)

OTHER PUBLICATIONS

International Search Report Dated Sep. 16, 2020 for International Patent Application No. PCT/US2020/035818.

*Primary Examiner* — Didarul A Mazumder
(74) *Attorney, Agent, or Firm* — Christopher M. Spletzer, Sr.

(57) ABSTRACT

A method of determining a bonding status between a wire and at least one bonding location of a workpiece is provided. The method includes the steps of: (a) bonding a portion of a wire to a bonding location of a workpiece using a bonding tool of a wire bonding machine; (b) determining a motion profile of the bonding tool for determining if the portion of the wire is bonded to the bonding location, the motion profile being configured to result in the wire being broken during the motion profile if the portion of the wire is not bonded to the bonding location; and (c) moving the bonding tool along the motion profile to determine if the portion of the wire is bonded to the bonding location. Other methods of determining a bonding status between a wire and at least one bonding location of a workpiece are also provided.

17 Claims, 11 Drawing Sheets

Related U.S. Application Data

(60) Provisional application No. 62/857,027, filed on Jun. 4, 2019.

(58) Field of Classification Search
CPC ......... H01L 24/48; H01L 24/78; H01L 22/12; H01L 22/14; H01L 2224/78347; H01L 2224/78901
See application file for complete search history.

(56) References Cited

U.S. PATENT DOCUMENTS

| | | |
|---|---|---|
| 9,379,086 B2 | 6/2016 | Kumamoto et al. |
| 9,484,323 B2 | 11/2016 | Jeong |
| 10,121,759 B2 | 11/2018 | Shah et al. |
| 2005/0133566 A1 | 6/2005 | Variyam |
| 2010/0108744 A1* | 5/2010 | Qin ..................... B23K 20/004 228/103 |
| 2010/0237480 A1* | 9/2010 | Mii ........................ H01L 24/49 257/784 |
| 2011/0290860 A1 | 12/2011 | Yang et al. |
| 2012/0032354 A1 | 2/2012 | Pham et al. |
| 2014/0131425 A1 | 5/2014 | Liu et al. |
| 2019/0148349 A1* | 5/2019 | Kim ....................... H01L 25/18 257/738 |
| 2020/0006161 A1 | 1/2020 | Gillotti |

FOREIGN PATENT DOCUMENTS

| | | |
|---|---|---|
| KR | 10-2016-0021675 | 2/2016 |
| KR | 10-2017-0052484 | 5/2017 |
| TW | 200631112 | 9/2006 |
| WO | 2009/002345 | 12/2008 |

\* cited by examiner

METHODS OF DETECTING BONDING BETWEEN A BONDING WIRE AND A BONDING LOCATION ON A WIRE BONDING MACHINE

CROSS REFERENCE TO RELATED APPLICATION

This application is a division of U.S. patent application Ser. No. 16/890,823 filed Jun. 2, 2020, which claims the benefit of U.S. Provisional Patent Application No. 62/857,027 filed Jun. 4, 2019, the contents of both of which are incorporated herein by reference.

FIELD

The invention relates to the formation of wire loops and other wire bonded structures, and more particularly, to improved methods of detecting the status of a bonded portion of a wire.

BACKGROUND

In the processing and packaging of semiconductor devices, wire bonding (e.g., ball bonding, wedge bonding, etc.) continues to be a widely used method of providing electrical interconnection between locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence (using ball bonding techniques) of a simple wire loop includes: (1) forming a free air ball on an end of a wire extending from a bonding tool; (2) forming a first bond of a wire loop on a die pad of a semiconductor die using the free air ball; (3) extending a length of wire in a desired shape between the die pad and a lead of a leadframe; (4) stitch bonding the wire to the lead of the leadframe to form a second bond of the wire loop; and (5) severing the supply wire from the now formed wire loop. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

In connection with wire bonding, it is often desirable to confirm that a portion of wire is properly bonded to a bonding location. Wire bonding machines marketed by Kulicke and Soffa Industries, Inc. often utilize a "BITS" process (i.e., bond integrity test system) to confirm that proper wire bonds have been formed. International Patent Application Publication WO 2009/002345, which is incorporated by reference herein in its entirety, illustrates exemplary details of such processes and related systems.

Thus, it would be desirable to provide improved methods of determining a bonding status of a portion of a wire loop (e.g., to determine if the portion of the wire loop is properly bonded to a bonding location).

SUMMARY

According to an exemplary embodiment of the invention, a method of determining a bonding status between a wire and at least one bonding location of a workpiece is provided. The method includes the steps of: (a) bonding a portion of a wire to a bonding location of a workpiece using a bonding tool of a wire bonding machine; (b) determining a motion profile of the bonding tool (thus providing a predetermined motion profile) for determining if the portion of the wire is bonded to the bonding location, the motion profile being configured to result in the wire being broken during the motion profile if the portion of the wire is not bonded to the bonding location; and (c) moving the bonding tool along the motion profile to determine if the portion of the wire is bonded to the bonding location.

Such methods may be used to check the bonding status of a plurality of portions of the wire bonded to a corresponding plurality of bonding locations of the workpiece. In such an event, steps (b) and (c) described in the prior paragraph may be repeated for each of the plurality of portions of the wire to determine if each of the plurality of portions of the wire are bonded to their corresponding bonding location of the workpiece.

According to another exemplary embodiment of the invention, another method of determining a bonding status between a wire and at least one bonding location of a workpiece is provided. The method includes the steps of: (a) bonding a portion of a wire to a bonding location of a workpiece using a bonding tool of a wire bonding machine; (b) detecting, during step (a), at least two of (i) a deformation characteristic related to bonding the portion of wire, (ii) a bond force characteristic related to bonding the portion of wire, and (iii) a transducer characteristic of a transducer of the wire bonding machine; and (c) determining a bonding status of the portion of the wire that was bonded to the bonding location in step (a) using information detected in step (b).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

According to certain exemplary embodiments of the invention, real time bond lift detection for workpieces (e.g., semiconductor devices such as memory based semiconductor devices, stacked-die memory devices, etc.) is provided. In such memory based semiconductor devices, a portion of wire may be configured to be at least one of a power lead or a ground lead of the memory based semiconductor device.

Aspects of the invention are particularly applicable to multi-stitch-bonding processes (i.e., wire loops including more than two bonded portions—for example, wire loops including three, four, five, or more bonded portions). For multi-stitch die-to-die bonding, detecting stitch bond lifts can be difficult since die to die impedance is very low.

Aspects of the invention will force a bonding wire to break if the bond is not stuck properly on a bonding location. Detecting the broken wire can be accomplished using existing detection systems (e.g., a BITS system) that detect electrical continuity (or a lack of electrical continuity). Such detection is easy for a broken wire which exhibits a high impedance, making clear that the wire is not secure to the proper bonding location.

Thus, the determination of whether the wire is broken may be made using a detection system of the wire bonding machine. For example, the detection system detects whether a conductive path is established between (a) the wire, and (b) a portion of the wire bonding machine. The conductive path includes at least one of (a) a wire clamp for clamping the wire, (b) a wire spool for supplying the wire to the bonding tool, (c) a diverter element for assisting in positioning of the wire between the wire spool and the bonding tool, and (d) an air guide system for assisting in positioning of the wire between the wire spool and the bonding tool. The detection system may detect whether the conductive path is established by detecting at least one of (a) a predetermined current flow in the conductive path, (b) a predetermined change in capacitance between the conductive path and a ground connection of the wire bonding machine, and (c) a predetermined phase shift of current flowing in the conductive path.

According to certain exemplary embodiments of the invention, methods of determining/detecting a bonding status (e.g., if a portion of wire is properly bonded, if a portion of wire is not properly bonded, etc.) of a wire bond connection on a workpiece are provided. For example, such methods may be performed in real time on a production wire bonding system (e.g., a wire bonding machine).

Figure 1A:
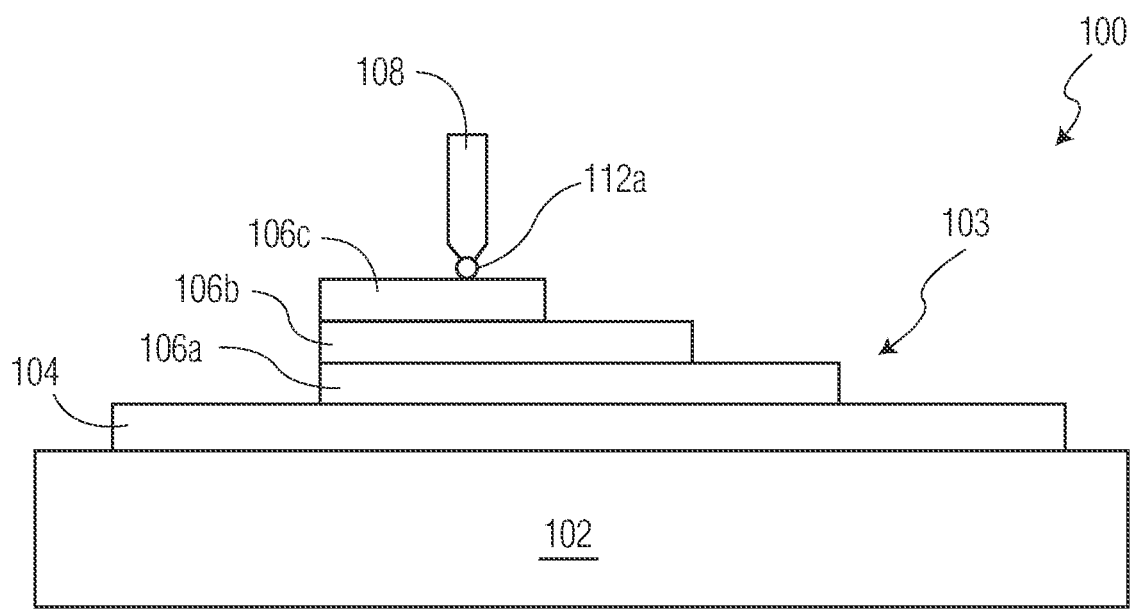
FIGS. 1A-1H are a series of block diagram views of a wire bonding system, illustrating a method of determining that a bonded portion of wire is bonded to a bonding location, in accordance with an exemplary embodiment of the invention.

Referring now to FIGS. 1A-1H, a wire bonding system 100 is provided. Wire bonding system 100 includes a support structure 102 (e.g., a heat block, an anvil, etc.) for supporting a workpiece 103. As shown in FIG. 1A, workpiece 103 includes a substrate 104, and a plurality of stacked semiconductor die 106a, 106b, and 106c.

Figure 1B:
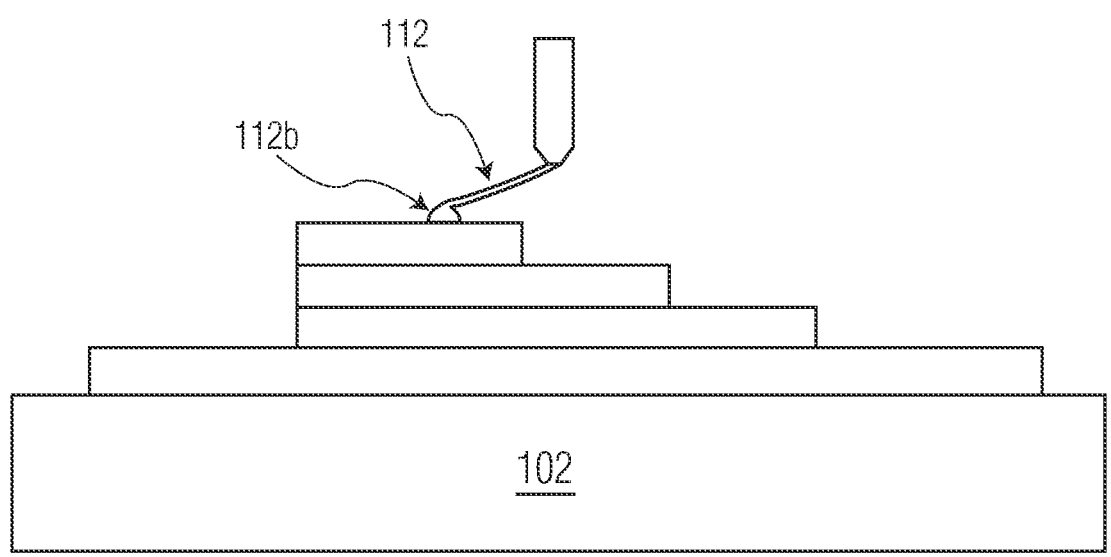
Figure 1C:
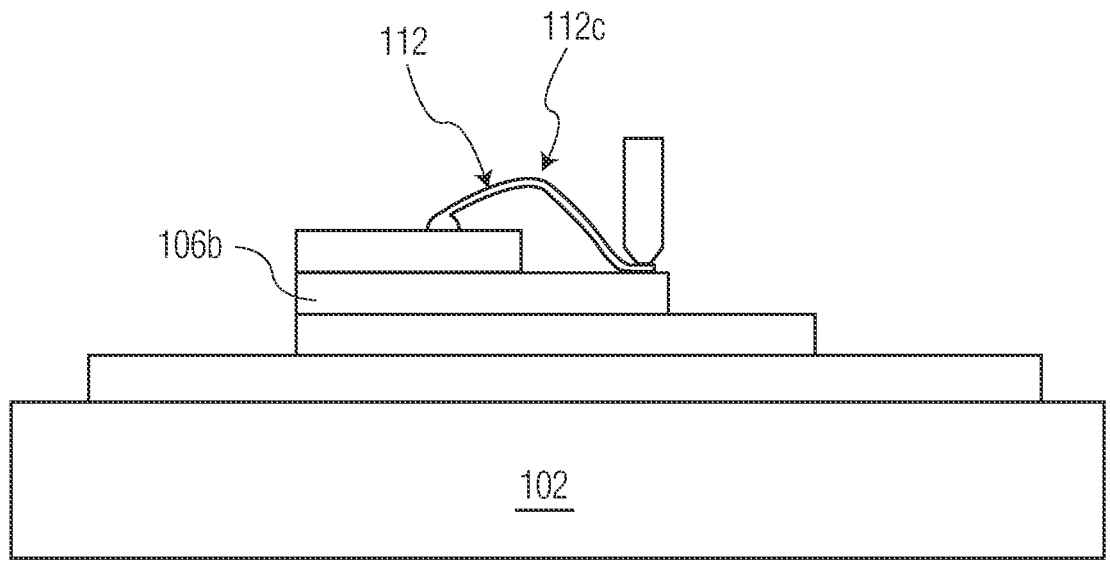
Figure 1D:
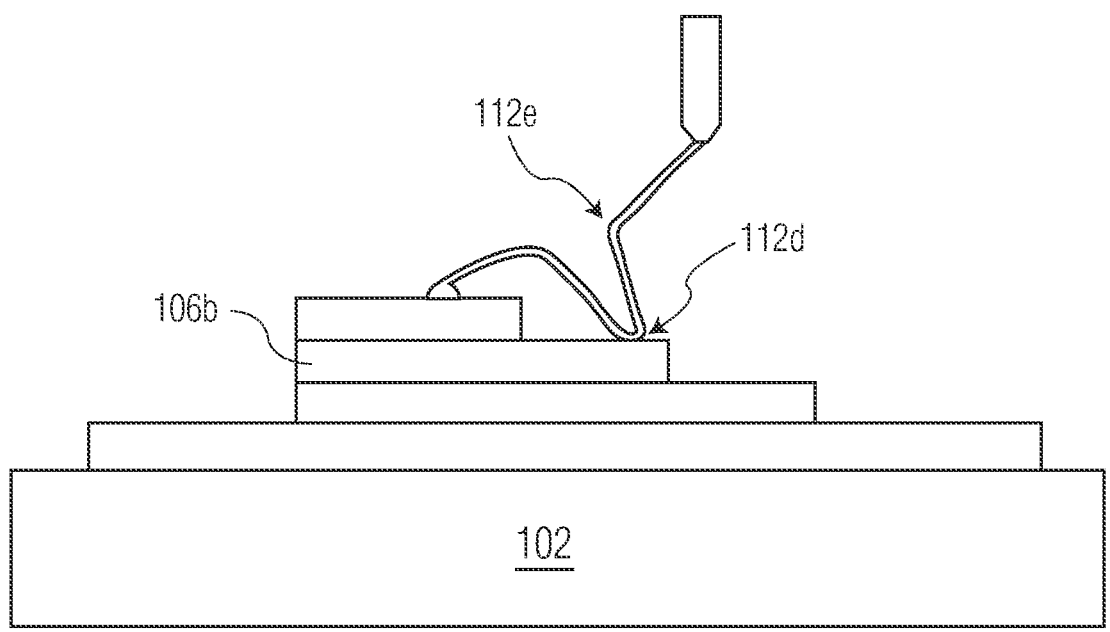
Figure 1E:
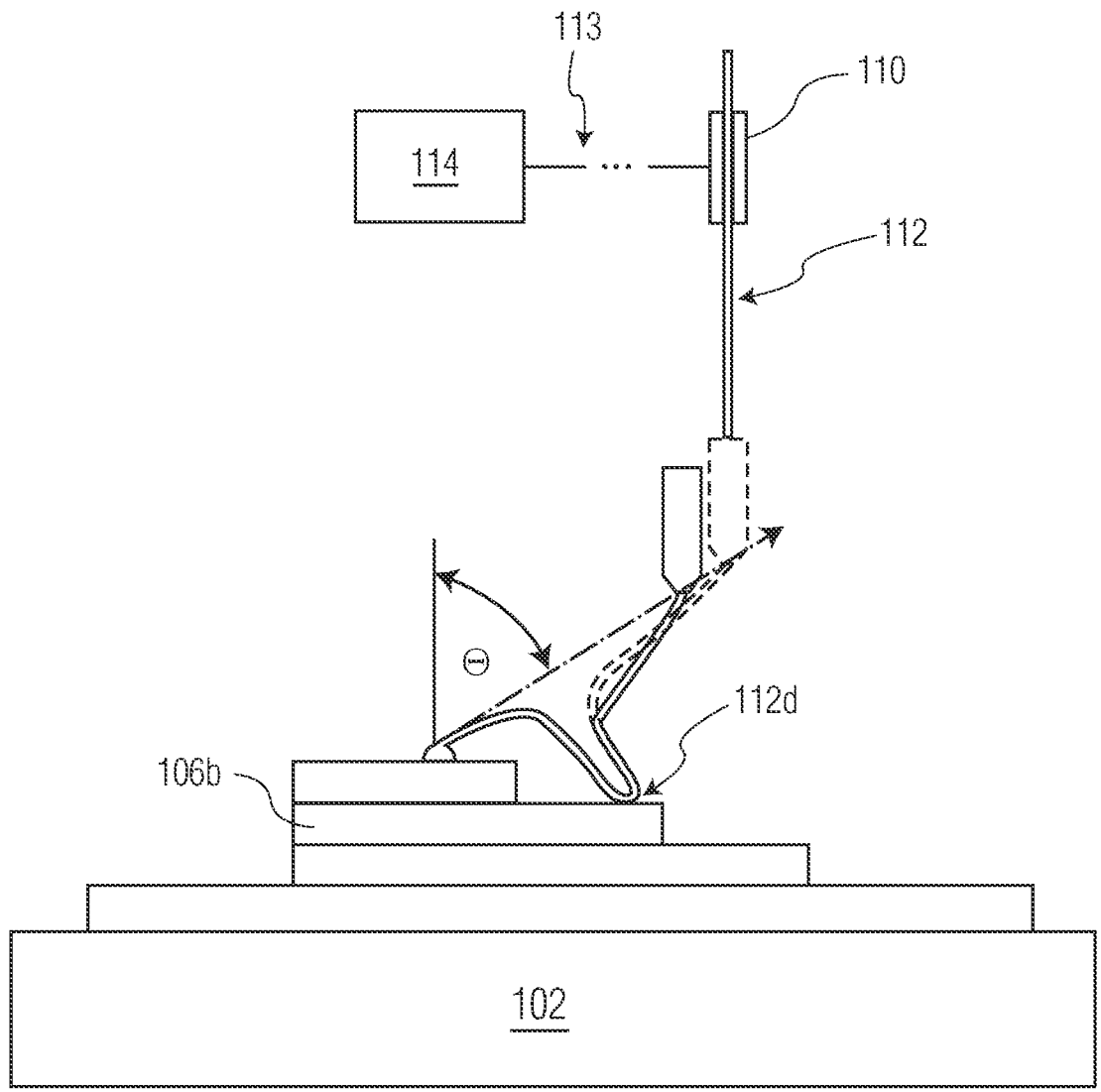

In FIGS. 1A-1H, wire bonding system 100 also includes wire bonding tool 108 (e.g., a capillary wire bonding tool), a wire clamp 110, and a detection system 114 (e.g., a BITS system). A length of wire 112 is provided to wire bonding tool 108 through wire clamp 110. In FIG. 1A, a free air ball 112a (i.e., a portion of wire 112) is seated at the tip of wire bonding tool 108. Referring to FIG. 1E, an electrical connection 113 is provided between wire clamp 110 and detection system 114. As is known to those skilled in the art, using detection system 114, with wire clamp 110 in a closed position as shown in FIG. 1E, electrical continuity may be detected between detection system 114 and a portion of wire bonded to workpiece 103.

Using various methods of the invention, real-time feedback regarding the the bonding status of a portion of a wire loop (or other portion of wire such as a conductive bump) may be provided to the wire bonding system.

In FIG. 1A, free air ball 112a is bonded to a bonding location (e.g., a die pad) of die 106c. At FIG. 1B, free air ball 112a has been transformed to bonded wire portion 112b.

Also at FIG. 1B, a portion of wire 112 is extended from bonded wire portion 112b and bonding tool 108. As FIG. 1C, wire 112 has further been shaped to include kink 112c, and another wire bond is being formed between wire 112 and a bonding location of die 106b. At FIG. 1D, this wire bond is shown as bonded wire portion 112d, and another length of wire 112 extends from bonded wire portion 112d to bonding tool 108 including kink 112e.

At this time, it is desirable to determine the bonding status of bonded wire portion 112d (e.g., if bonded wire portion 112d is properly bonded to a bonding location of die 106b). Thus, as shown in FIG. 1E, with wire clamp 110 in a closed position, wire bonding tool 108 is moved along a predetermined motion profile (where the motion profile may include a predetermined directions, distances, angles, etc.) (see dotted line bonding tool 108 having moved along the motion profile, stretching the wire as shown in the dotted line, but not disrupting bonded wire portion 112d). Thus, as shown in FIG. 1E, bonded wire portion 112d is still properly bonded to a bonding location of die 106b, as is detected using detection system 114. At FIGS. 1F-1G, the remainder of a wire loop (labeled as wire loop 116 in FIG. 1H), including bonded wire portion 112f, is formed.

Figure 1F:
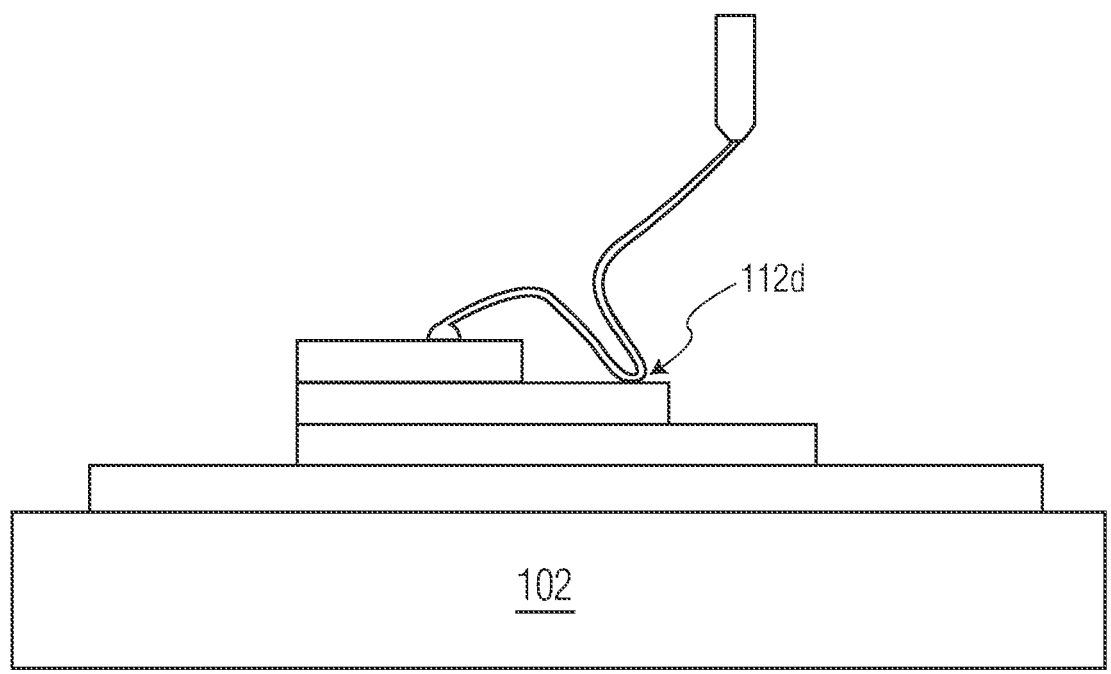
Figure 1G:
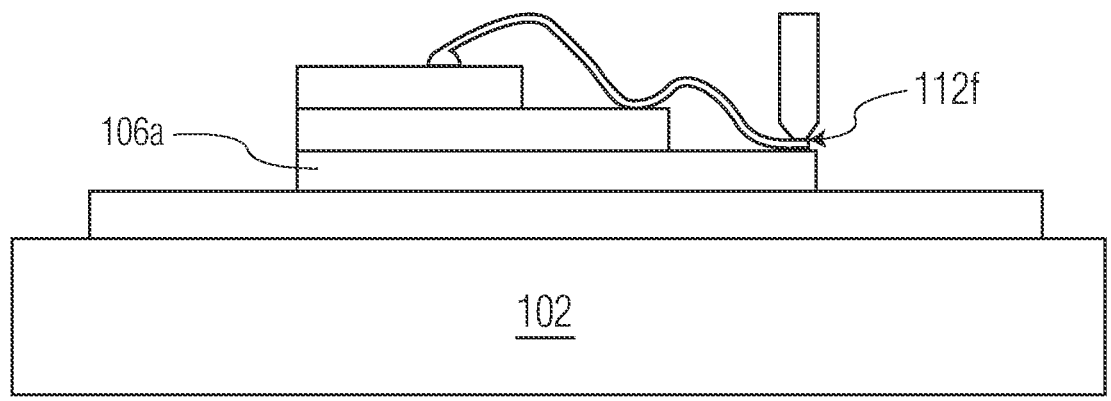
Figure 1H:
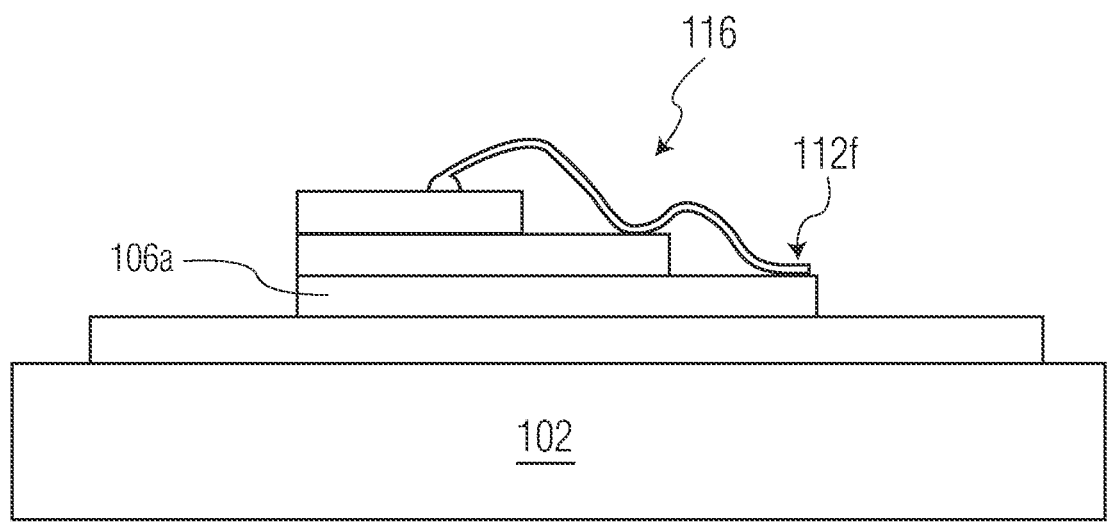
Figure 2A:
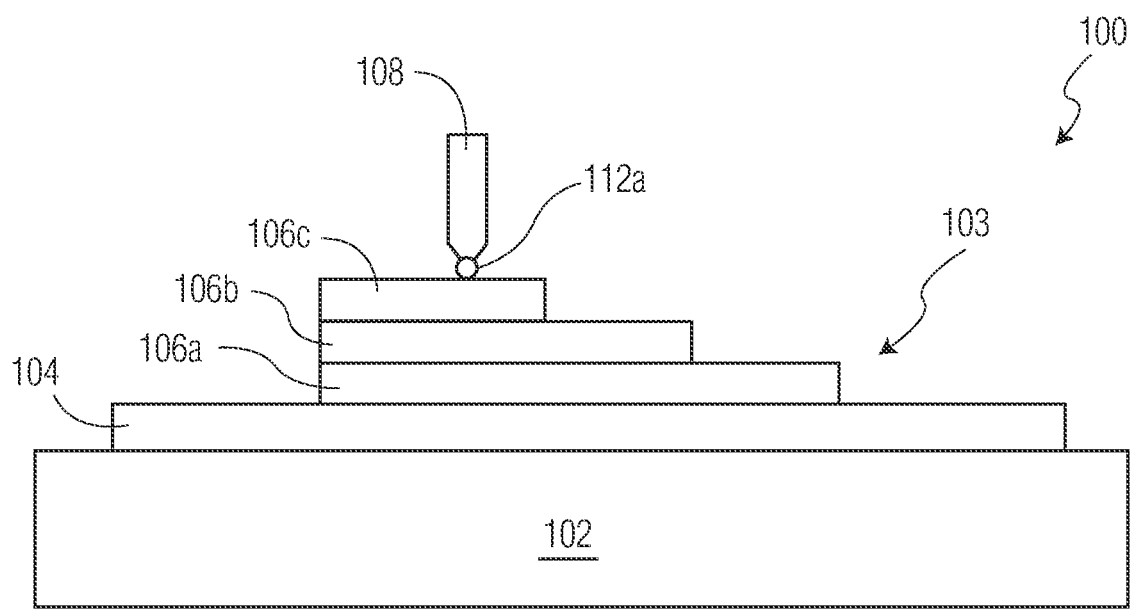
FIGS. 2A-2F are a series of block diagram views of a wire bonding system, illustrating a method of determining that a bonded portion of wire is not bonded to a bonding location, in accordance with an exemplary embodiment of the invention.
Figure 2B:
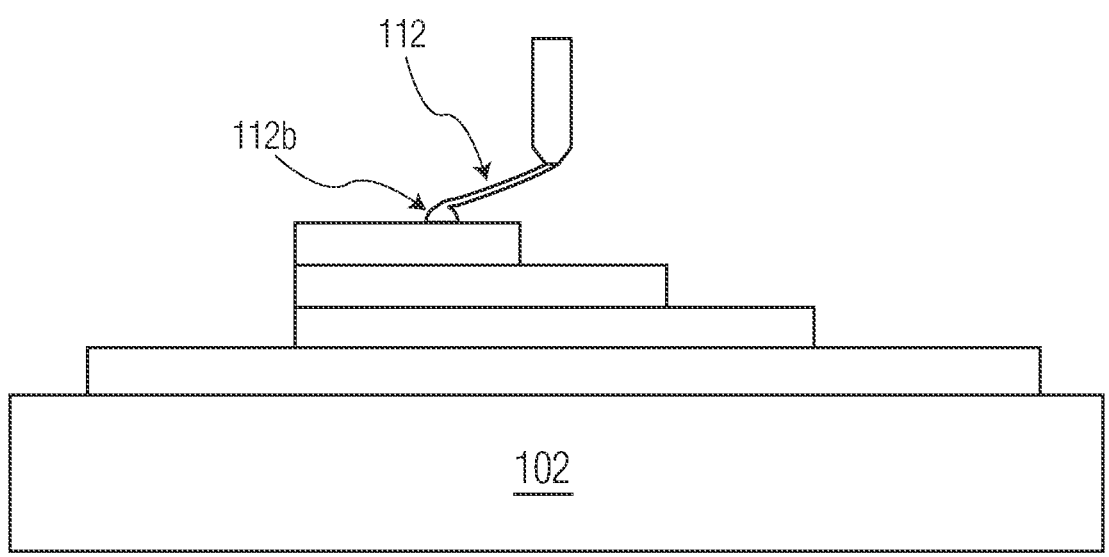
Figure 2C:
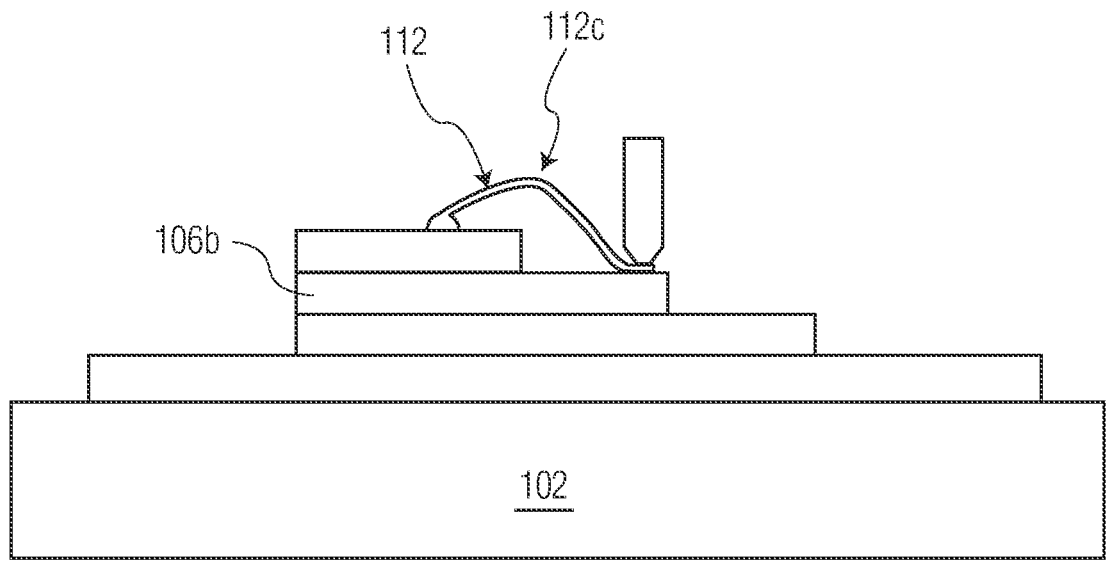
Figure 2D:
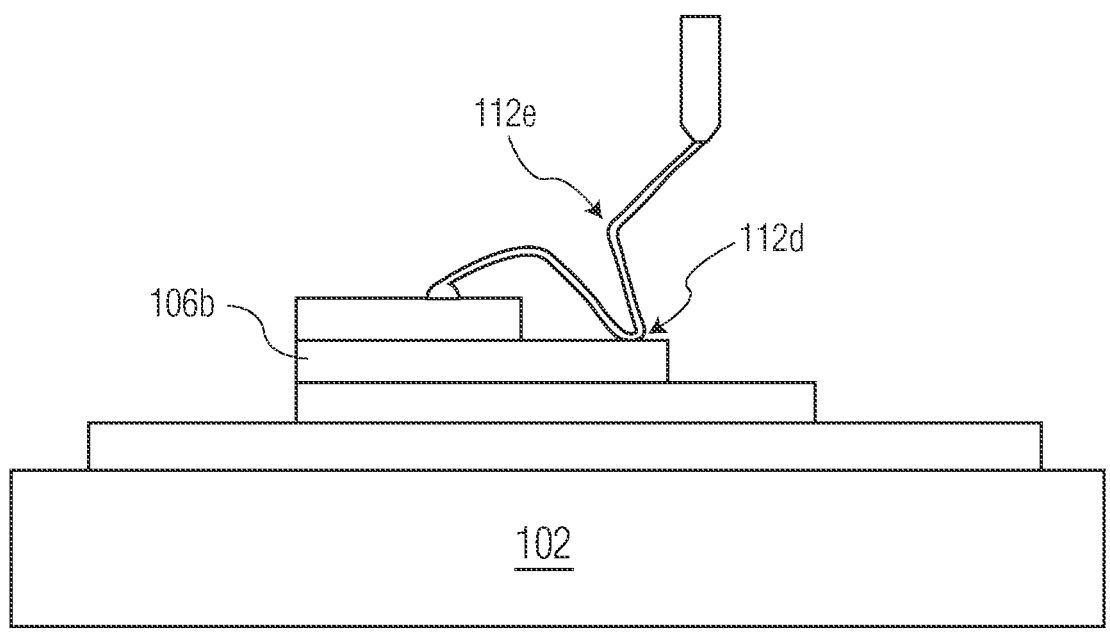
Figure 2E:
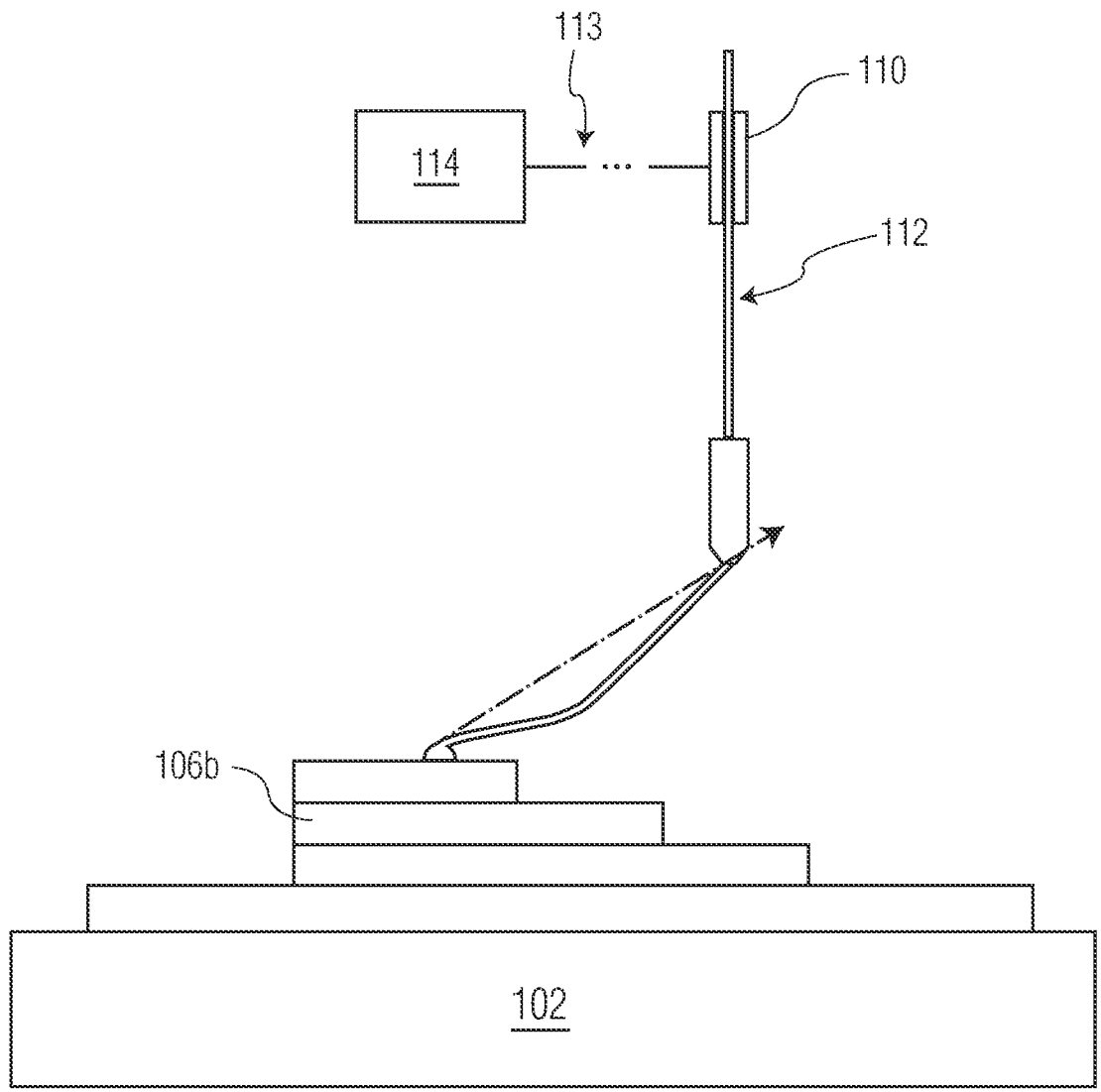
Figure 2F:
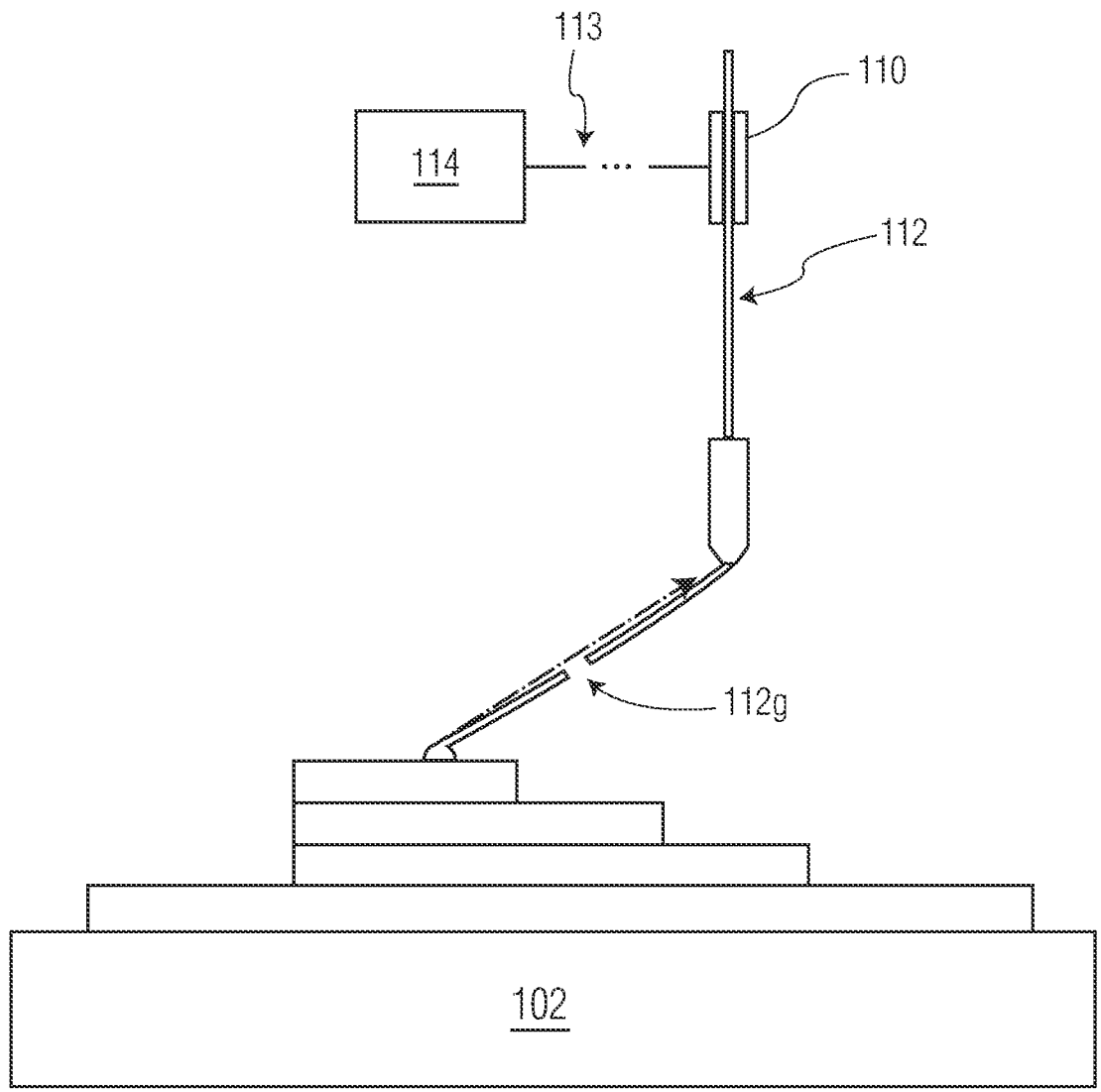

FIGS. 2A-2F illustrate substantially similar elements as in FIGS. 1A-1H, but with a different result. As shown in FIG. 2E, bonded wire portion 112d (shown in FIG. 2D) did not stick to the bonding location of die 106b, or otherwise pulled away from the bonding location with the predetermined motion profile (i.e., the dotted line arrow shown in FIG. 2E). As bonding tool 108 moves further along the motion profile as shown in FIG. 2F, wire break 112g occurs as detected by detection system 114. Because wire break 112g is detected by detection system 114, the bonding status of bonded wire portion 112d is known as "unacceptable" or "unbonded" or "lifted-off" or some similar status.

Thus, in FIGS. 1A-1H, it has been determined that bonded portion 112d is bonded to a bonding location of die 106b. In FIGS. 2A-2F, it has been determined that bonded portion 112d is not bonded to a bonding location of die 106b.

In FIGS. 1A-1H and in FIGS. 2A-2F only one bonded portion (i.e., bonded portion 112d) is checked using the inventive bonding status check. However, it is understood that multiple bonded portions may be checked using the invention. For example, each bonded portion of wire loop 116 shown in FIG. 1H (i.e., bonded wire portion 112b, bonded portion 112d, and bonded portion 112f) may be checked using a motion profile such as the motion profile shown and described in connection with FIG. 1E.

In a specific example, after formation of bonded wire portion 112b (see FIG. 1B) a predetermined motion profile may be used to check the bonding status of bonded wire portion 112b. After checking the bonding status of bonded wire portion 112b, bonded portion 112d may be formed (see FIG. 1D). After formation of bonded portion 112d, the predetermined motion profile of FIG. 1E may be used to check the bonding status of bonded wire portion 112d. After checking the bonding status of bonded wire portion 112d, bonded portion 112f may be formed (see FIG. 1G). After formation of bonded portion 112f (but before separation of wire loop 116 from the wire source), a predetermined motion profile may be used to check the bonding status of bonded wire portion 112f. Thus, it is clear that the inventive techniques described above in connection with FIGS. 1A-1H and FIGS. 2A-2F may be used to check the bonding status of any number of bonded portions of a wire loop.

It will be appreciated that, in accordance with aspects of the invention (such as shown in FIGS. 1A-1H and FIGS.

2A-2F), a step of determining a motion profile of the bonding tool for determining if the portion of the wire is bonded to the bonding location may be included. That is, prior to forming a bonded portion of a wire loop (such as bonded portion 112*d* in FIG. 1D), a motion profile may be determined. That is, prior to following the motion profile (as in FIG. 1E), the motion profile should be determined. Such a motion profile may be configured to result in the wire being broken (e.g., see FIG. 2F) during the motion profile if the portion of the wire is not bonded to the bonding location. The motion profile may be determined through a trial and error process (or other process such as an iterative process), using information relevant to the specific application (e.g., bonding locations of the various bonded portions of the wire loops, wire looping parameters, etc.).

FIGS. 1A-1H and FIGS. 2A-2F illustrate certain exemplary methods of determining a bonding status of bonded portions of a wire (e.g., a wire loop) bonded to a workpiece. However, the invention contemplates additional methods of determining the bonding status of the bonded wire portions. As described below, in other exemplary embodiments of the invention, information detected by a wire bonding machine (e.g., a deformation characteristic related to bonding a portion of wire, a bond force characteristic related to bonding the portion of wire, a transducer characteristic of a transducer of the wire bonding machine, etc.) during a wire bonding process may also be used to determine a bonding status between a wire and at least one bonding location of a workpiece.

Figure 3:
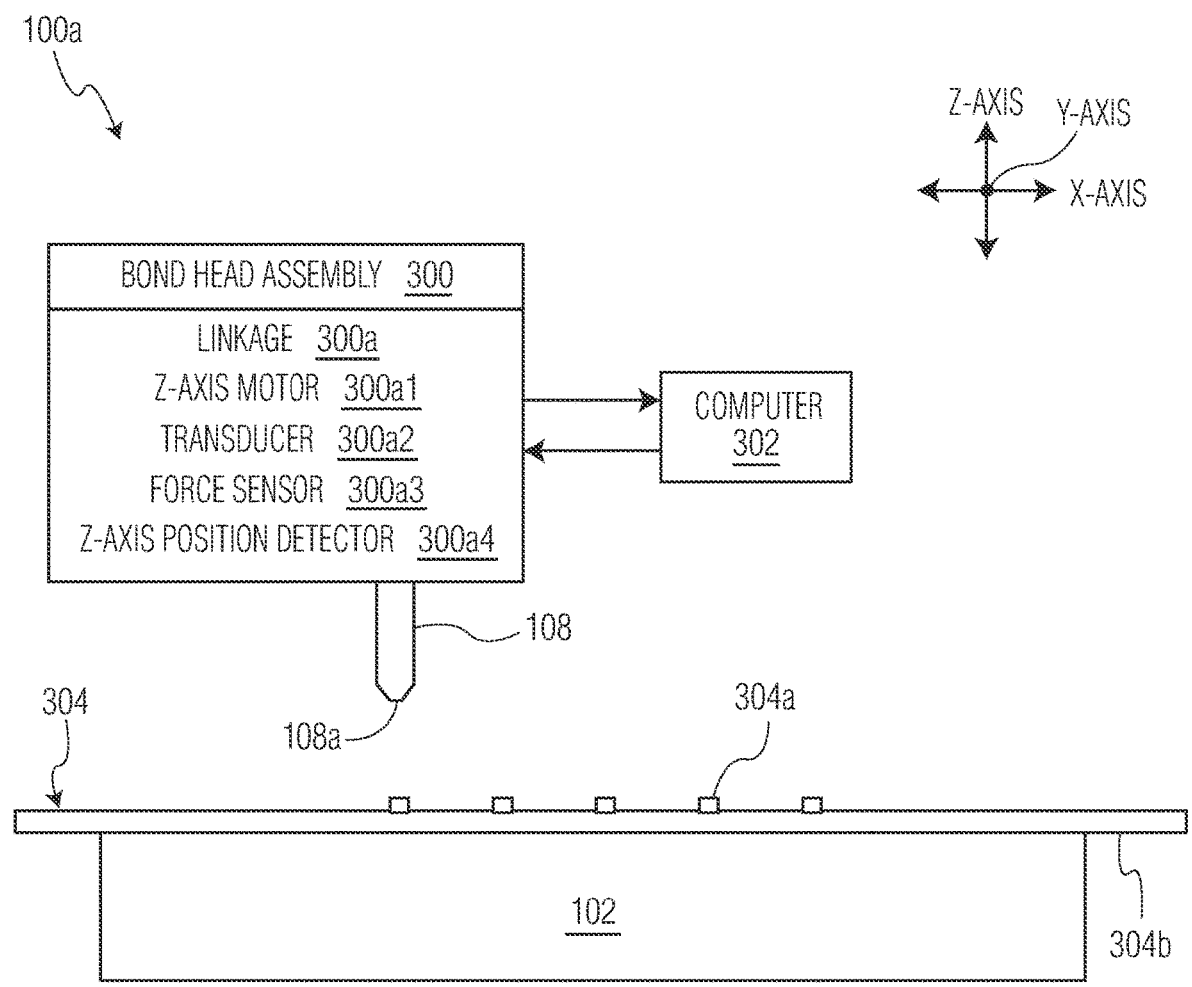
FIG. 3 is a block diagram of a conventional wire bonding machine useful for illustrating certain exemplary methods in accordance with the invention.

FIG. 3 is a side view of a simplified wire bonding machine 100*a* (which may be similar to, or the same as, wire bonding machine 100 of FIGS. 1A-1H) which may be used to detect the information described in the immediately preceding paragraph, and in other parts of the present application. Wire bonding machine 100*a* includes support structure 102 (e.g., a heat block, an anvil, etc.) for supporting a semiconductor element 304 during a wire bonding operation. In the illustrated example in FIG. 1A, semiconductor element 304 includes a plurality of semiconductor die 304*a* on a leadframe 304*b*. Of course, other types of semiconductor elements (e.g., such as memory based semiconductor devices, stacked die devices, among others) are contemplated within the scope of the invention.

Wire bonding machine 100*a* also includes wire bonding tool 108 (e.g., a capillary wire bonding tool, etc.) for bonding wire portions to semiconductor element 304. As will be appreciated by those skilled in the art, wire bonding tool 108 (carried by bond head assembly 300) is movable along a plurality of axes of wire bonding machine 100*a* to perform wire bonding operations. For example, wire bonding tool 108 is moved along the x-axis and y-axis through movement of bond head assembly 300. A linkage 300*a* is carried by bond head assembly 300 and wire bonding tool 108. This linkage 110*a* is configured for movement along the z-axis of wire bonding machine 100*a*. Additional elements carried by bond head assembly 300 (and specifically carried by linkage 300*a*) includes: a movable portion of z-axis motor 300*a*1 which moves along the z-axis with linkage 300*a*; a transducer 300*a*2 for carrying wire bonding tool 108, and for providing ultrasonic scrub to tip portion 108*a* of wire bonding tool 108; a force sensor 300*a*3 for sensing a bonding force applied during wire bonding operations; and a z-axis position detector 300*a*4 (e.g., a z-axis encoder). As is known by those skilled in the art, z-axis position detector 300*a*4 detects the z-axis position of linkage 300*a* (and hence a relative z-axis position of bonding tool 108), and provides data corresponding to this z-axis position (e.g., real time) to computer 302 of wire bonding machine 100*a*. Thus, computer 302 has information related to the z-axis position of bonding tool 108 through its motions. Certain information from each of z-axis motor 300*a*1, transducer 300*a*2, force sensor 300*a*3, and z-axis position detector 300*a*4 may be provided to computer 302 (as shown by the arrow extending from bond head assembly 300 and computer 302). Computer 302 may also provide information (e.g., instructions) back to elements of bond head assembly 300 (as shown by the arrow extending from computer 302 to bond head assembly 300). In a specific example, in a closed loop configuration, computer 302 provides control signals to one z-axis motor 300*a*1 and/or transducer 300*a*2.

Figure 4:
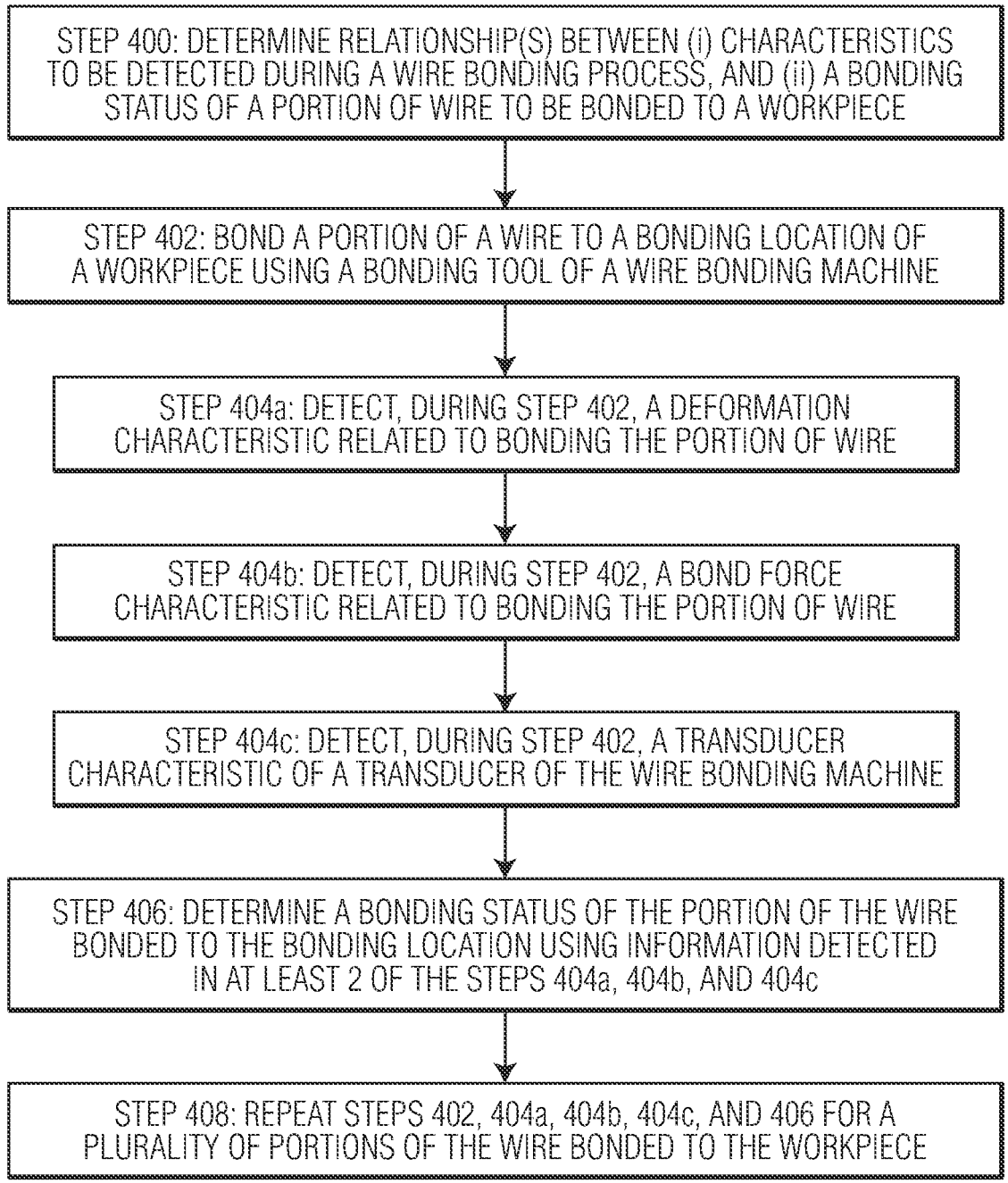
FIG. 4 is a flow diagram illustrating exemplary methods of determining a bonding status of a portion of wire bonded to a bonding location on a wire bonding machine in accordance with various exemplary embodiments of the invention.

FIG. 4 is a flow diagram illustrating exemplary methods in accordance with the invention. As is understood by those skilled in the art, certain steps included in the flow diagram may be omitted; certain additional steps may be added; and the order of the steps may be altered from the order illustrated—all within the scope of the invention.

FIG. 4 is a flow diagram illustrating exemplary methods of determining a bonding status of a portion of wire bonded to a bonding location on a wire bonding machine, such as wire bonding machine 100 of FIGS. 1A-1H and FIGS. 2A-2F (or wire bonding machine 100*a* of FIG. 3, or other wire bonding machines within the scope of the invention).

At Step 400, relationships are determined between (i) characteristics to be detected during a wire bonding process, and (ii) a bonding status of a portion of wire to be bonded to a workpiece. The characteristics may include, for example, any two or more of: a deformation characteristic related to bonding the portion of wire; a bond force characteristic related to bonding the portion of wire; and a transducer characteristic of a transducer of the wire bonding machine. The bonding status may include a simple status (e.g., "bonded" or "not bonded"), or may be somewhat more specific (e.g., a "good" bond, an "acceptable" bond, an "unacceptable" bond, "a lift off condition", among other labels as determined by the user). Depending on the bonding status, operations may continue (e.g., in the case of a good bond or an acceptable bond), operations may stop (e.g., the wire bonding operation may stop in the event of an "unacceptable" bond or a "lift off condition"), an alarm or other notification may be provided (e.g., in the case of acceptable bond, an unacceptable bond, a lift off condition, etc.), etc. The specific labels applied (the bonding status), and the action taken related to such a label (e.g., continuing wire bonding operations, stopping wire bonding operations, providing an alarm of other notification, etc.), may be customized for the application and/or user.

In a more specific example, testing/experimentation may be done on one or more wire bonding applications (e.g., using a specific die, specific wire, specific wire bonding parameters—which may be optimized using a closed loop process, specific wire looping parameters—which may be optimized using a closed loop process, etc.). Through this testing/experimentation—values of the aforementioned characteristics (e.g., deformation characteristics, bond force characteristics, transducer characteristics, etc.) may be detected and recorded. Various ranges for each of the characteristics, and combined ranges for the multiple characteristics, may be determined.

For example, a range for each bonding status (e.g., a good bond, an acceptable bond, an unacceptable bond, a lift off condition, etc.) may be provided by the testing/experimentation. Likewise, each bonding status may be assigned to combined ranges of the characteristics.

In a specific example, let us assume that each of a deformation characteristic, a bond force characteristic, and a transducer characteristic is monitored. A "good bond" bonding status may be applied to a situation when each of the three characteristics falls within a predetermined range for that characteristic. An "acceptable bond" bonding status may be applied when one or more of the three characteristics falls within a predetermined range for that characteristic that is not in the "good" range, but is in an "acceptable" range. An "unacceptable bond" bonding status may be applied when one or more of the three characteristics falls within a predetermined range for that characteristic that is not in the "good" range or the "acceptable" range, but is in an "unacceptable" range. And so on.

At Step 402, a portion of a wire is bonded to a bonding location of a workpiece using a bonding tool of a wire bonding machine. For example, FIG. 1F illustrates a bonded wire portion 112d (of the to be formed wire loop 116, as shown in FIG. 1H) bonded to a bonding location of die 106b.

At Step 404a, a deformation characteristic related to the bonded portion of wire is detected during Step 402. The deformation characteristic relates to a vertical deformation of the portion of wire during Step 402, for example, as measured by a z-axis position detector (e.g., see z-axis position detector 300a4 in FIG. 3). The deformation may be considered the measured deformation between (i) contact of the wire portion with the bonding location, and (ii) the completion of the bonding process of Step 402. The deformation characteristic may relate to single value (i.e., a single z-axis measurement/value) taken during Step 402, or may relate to a series of values (i.e., a series of measurements/values versus time, such as a deformation profile) taken during Step 402.

At Step 404b, a bond force characteristic related to bonding the portion of wire is detected. The bond force characteristic may relate to a bond force measured by at least one of (i) a force sensor in a bond head of the wire bonding machine (e.g., see force sensor 300a3 in FIG. 3), and (ii) a z-axis motor characteristic of a z-axis motor of the wire bonding machine (see z-axis motor 300a1 in FIG. 3). The bond force characteristic may relate to single value (i.e., a single bond force measurement/value) taken during Step 402, or may relate to a series of values (i.e., a series of measurements/values versus time, such as a bond force profile) taken during Step 402.

At Step 404c, a transducer characteristic of a transducer of the wire bonding machine is detected. As will be appreciated by those skilled in the art, a typical wire bonding machine includes an ultrasonic transducer carried by a bond head assembly. The ultrasonic transducer typically carries a wire bonding tool (e.g., see wire bonding tool 108 in FIGS. 1A-1H), and applies an ultrasonic scrub to a tip portion of the wire bonding tool to bond wire portions to bonding locations. In accordance with the invention, the transducer characteristic may relate to any of a number of characteristics such as, for example: (i) an impedance of the transducer; and (ii) an electrical characteristic of the transducer (e.g., a voltage measurement, a current measurement, etc.). The transducer characteristic may relate to single value (i.e., a single transducer measurement/value) taken during Step 402, or may relate to a series of values (i.e., a series of measurements/values versus time, such as a transducer profile) taken during Step 402.

At Step 406, a bonding status of the portion of the wire bonded to the bonding location in Step 402 is determined using information detected in at least two of Steps 404a, 404b, and 404c (e.g., using the deformation characteristic and the bond force characteristic, using the deformation characteristic and the transducer characteristic, using the bond force characteristic and the transducer characteristic, using all 3 of the deformation characteristic and the bond force characteristic and the transducer characteristic). As described above, the bonding status may be a "good" bond, an "acceptable" bond, an "unacceptable" bond, a "lift off condition", or any other bonding status.

At Step 408, a plurality of portions of the wire are bonded to a corresponding plurality of bonding locations of the workpiece, and Steps 404 (including at least two of Steps 404a, 404b, and 404c) and Step 406 are repeated for each of the plurality of portions of the wire to determine if each of the plurality of portions of the wire are bonded to their corresponding bonding location of the workpiece. For example, referring to FIGS. 1A-1H, each of the wire bonded portions (i.e., wire bonded portions 112b, 112d, and 112f) may be checked using Steps 404 and 406, after formation of the specific wire bonded portion and before formation of the next wire bonded portion.

Although the invention is illustrated with respect to specific workpieces, it is not limited thereto. That is, a stacked die application of FIGS. 1A-1H and FIGS. 2A-2F, and the simple semiconductor die/leadftame application in FIG. 3, simply illustrate exemplary workpieces. Any type of workpiece may be utilized that incorporates wire bonding.

Although the invention has been illustrated with respect to certain wire loop shapes, it is not limited thereto. Aspects of the invention may be utilized to detect bonding (or non bonding, or another bonding status) of any wire portions such as, for example: stud bumps; simple wire loops including a first bond and a second bond only; complex wire loops including multiple tiers and devices; etc.

Further still, it should be understood that if a wire loop includes multiple bonded portions, any or all of the bonded portions may be checked for proper bonding utilizing aspects of the invention. For example, conventional techniques may be adequate to detect proper bonding of certain bonded portions, while aspects of the invention may be used for other bonded portions.

It will be appreciated that data related to the one or more characteristics may also be saved in memory (e.g., memory of the wire bonding machine, or remote memory) for later analysis (e.g., to confirm the ranges for each bonding status are correct when analyzing specific workpieces that have completed a wire bonding operation).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a bonding status between a wire and at least one bonding location of a workpiece, the method comprising the steps of:
    (a) bonding a portion of the wire to the at least one bonding location of the workpiece using a bonding tool of a wire bonding machine;
    (b) detecting, during step (a), at least two of (i) a deformation characteristic related to bonding the portion of the wire, (ii) a bond force characteristic related to bonding the portion of the wire, and (iii) a transducer characteristic of a transducer of the wire bonding machine; and (c) determining the bonding status of the portion of the wire bonded to the at least one bonding location in step (a) using information detected in step (b).

2. The method of claim 1, wherein the workpiece is a memory based semiconductor device.

3. The method of claim 2, wherein the wire is configured to be at least one of a power lead or a ground lead of the memory based semiconductor device.

4. The method of claim 1, wherein a plurality of portions of the wire are bonded to a corresponding plurality of bonding locations of the workpiece, and wherein steps (b) and (c) are repeated for each of the plurality of portions of the wire to determine if each of the plurality of portions of the wire are bonded to the corresponding plurality of bonding locations of the workpiece.

5. The method of claim 1, wherein the information used in step (c) to determine if the portion of the wire is bonded to the at least one bonding location includes the deformation characteristic and the bond force characteristic.

6. The method of claim 1, wherein the information used in step (c) to determine if the portion of the wire is bonded to the at least one bonding location includes the deformation characteristic and the transducer characteristic.

7. The method of claim 1, wherein the information used in step (c) to determine if the portion of the wire is bonded to the at least one bonding location includes the transducer characteristic and the bond force characteristic.

8. The method of claim 1, wherein the information used in step (c) to determine if the portion of the wire is bonded to the at least one bonding location includes the deformation characteristic, the bond force characteristic, and the transducer characteristic.

9. The method of claim 1, wherein the deformation characteristic relates to a vertical deformation of the portion of wire during step (b) as measured by a z-axis position detector.

10. The method of claim 1, wherein the bond force characteristic relates to a bond force measured by at least one of (i) a force sensor in a bond head of the wire bonding machine, and (ii) a z-axis motor characteristic of a z-axis motor of the wire bonding machine.

11. The method of claim 1, wherein the transducer characteristic relates to at least one of (i) an impedance of the transducer, and (ii) an electrical characteristic of the transducer.

12. The method of claim 1, wherein the deformation characteristic relates to a single value obtained during step (b).

13. The method of claim 1, wherein the bond force characteristic relates to a single value obtained during step (b).

14. The method of claim 1, wherein the transducer characteristic relates to a single value obtained during step (b).

15. The method of claim 1, wherein the deformation characteristic relates to a series of values obtained during step (b).

16. The method of claim 1, wherein the bond force characteristic relates to a series of values obtained during step (b).

17. The method of claim 1, wherein the transducer characteristic relates to a series of values obtained during step (b).

* * * * *